United States Patent [19]
Charsky et al.

[11] 3,957,376
[45] May 18, 1976

[54] MEASURING METHOD AND SYSTEM USING A DIFFRACTION PATTERN

[75] Inventors: Ronald S. Charsky, Poughkeepsie; Gilbert E. Conn, Wappingers Falls; Alexander L. Flamholz, Monsey; Harold J. Young, Wappingers Falls, all of N.Y.

[73] Assignee: International Business Machines Corporation, Armonk, N.Y.

[22] Filed: Jan. 25, 1974

[21] Appl. No.: 436,411

[52] U.S. Cl. ............................ 356/106 R; 250/550; 356/109; 356/159
[51] Int. Cl.² ........................................... G01B 9/02
[58] Field of Search ............... 356/102, 106 R, 109, 356/209, 159; 250/578, 550

[56] References Cited
UNITED STATES PATENTS

| | | | |
|---|---|---|---|
| 3,518,007 | 6/1970 | Ito | 250/550 UX |
| 3,664,239 | 5/1972 | Pryor | 356/106 R X |
| 3,709,610 | 1/1973 | Kruegle | 356/111 X |
| 3,764,216 | 10/1973 | Bliek et al. | 356/106 |
| 3,797,939 | 4/1974 | Pryor | 356/109 X |

OTHER PUBLICATIONS

Watkins et al., "Dynamic Wire Measurements by New Inspection Techniques," *JASA*, Vol. 46, No. 2, pp. 314–315, Aug. 1969.
Watkins et al., "Dynamic Wire Measurements. . .," *IEEE J. of Quant. Elec.*, Vol. QE6, No. 1, p. 2, Jan. 1970.
*Computer Design*, Vol. 12, No. 6, p. 50, June 1973.

*Primary Examiner*—John K. Corbin
*Assistant Examiner*—Matthew W. Koren
*Attorney, Agent, or Firm*—Frank C. Leach, Jr.; Henry Powers

[57] ABSTRACT

A spot of collimated monochromatic radiation is applied to a semiconductor wafer to obtain a diffraction pattern from two edges within an area, which is the size of the spot, on the wafer. The diffraction pattern is reflected to a photodiode array wherein the light intensity of the diffraction pattern at each of a plurality of positions is obtained. Each of the photodiodes is scanned separately for the same period of time to determine the light intensity at its location. The distance between the zero intensity positions on the photodiode array is determined very precisely and utilized with the wavelength of a laser, which supplies the spot of collimated monochromatic radiation, and the effective focal length of the lens system, which images the diffraction pattern to the photodiode array, to calculate the linear distance between the edges.

32 Claims, 6 Drawing Figures

MEASURING METHOD AND SYSTEM USING A DIFFRACTION PATTERN

In manufacturing chips on a semiconductor wafer, various processes accomplish the exposing, developing, baking, etching, and removal of various materials. The final goal of all processing is to generate geometries with the appropriate dimensions to guarantee final electric performance. Thus, one must be able to verify all dimensional characteristics of a wafer at any level in the total manufacturing sequence. To avoid damage to the wafer, this should be done without contacting the wafer surface.

For example, line geometries formed on the kerf area of each chip of each wafer represent a suitable monitor of the various lines within the chip area. The time required to measure all lines within the chip area would not be financially feasible from a manufacturing through-put cost position; however, the automatic measurement of a line or lines in the kerf area of a chip will indicate whether the lines within the chip product area are within the desired range.

Thus, if the line in the kerf area of a chip is not within the desired range, a determination can be made as to whether the wafer should be discarded depending on how many different chips have the isolated lines in their kerf areas outside of the desired range. If it is determined that the wafer should be discarded, the determination of the width of the isolated line as not being within the range at this time reduces manufacturing cost.

In manufacturing chips on a semiconductor wafer, it also is desired to be able to determine if the overlay of patterns at different levels on a chip are within certain ranges relative to each other. These overlay ranges can be determined from a relationship of certain pattern overlays in the kerf area of each chip.

As a result, it is desired to be able to ascertain whether two line edges, which define the boundaries of the adjacent patterns at the different levels of the chip, are spaced from each other within a predetermined range. It also is desired to be able to do this without engaging the wafer.

The present invention provides a method and system for ascertaining the distance between two edges, which can be the width of a very narrow line or the boundaries of two adjacent patterns in different levels, without engaging the wafer. Furthermore, the method and system of the present invention is capable of accomplishing this without requiring any fine adjustment for X, Y, and Z alignment of the wafer. Angular alignment, though certainly necessary, need be done only once per wafer and can be accomplished through proper mechanical fixturing.

The present invention utilizes an arrangement in which a spot of collimated monochromatic radiation of a selected diameter is applied to the wafer. The diameter of the spot is selected so that it is at least ten times the distance between the two line edges, which are to be measured. Thus, the line edges will fall within some portion of the spot without any fine adjustment of the wafer for X, Y, and Z alignment.

The diffraction pattern produced by the reflection of the spot from the semiconductor wafer is supplied to a sensor such as a photodiode array, for example. The zero intensity positions in the diffraction pattern are then ascertained through serially scanning each of the photodiodes separately. The locations of adjacent zero intensity points in the diffraction pattern in conjunction with the wave length of the collimated monochromatic radiation and the effective focal length of the lens system for imaging the diffraction pattern to the photodiode array allow calculation of the distance between the two line edges.

By using the method and system of the present invention, it is not necessary to position the wafer or other target at a specific position along the direction of illumination of light. Thus, precise (X,Y,Z) positioning of the target is not necessary as long as it is within the field of collimated illumination.

An object of this invention is to provide a method and system for measuring micron distances between two line edges.

Another object of this invention is to provide a method and system in which measurement of the distance between the pattern edges is obtained without engaging the target having the pattern edges.

The foregoing and other objects, features, and advantages of the invention will be apparent from the following more particular description of a preferred embodiment of the invention as illustrated in the accompanying drawings.

Figure 3A:
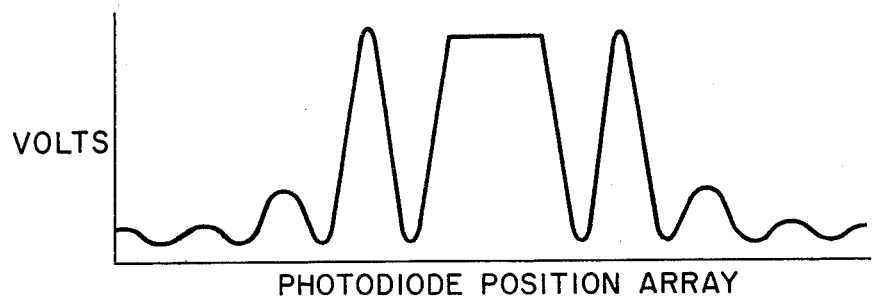
Figure 3B:
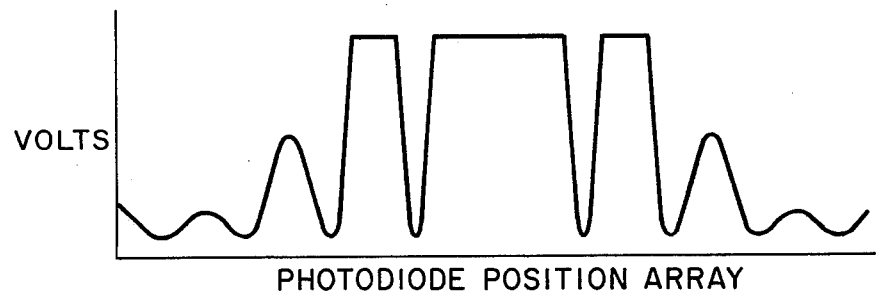
Figure 3C:
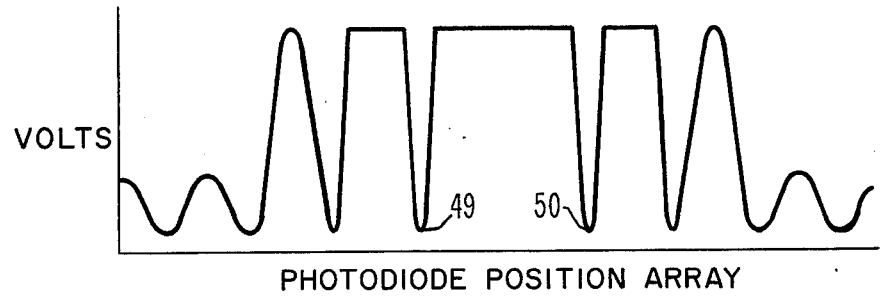

FIGS. 3A, 3B, and 3C show the relationship between voltages and photodiode positions as determined from the photodiode array with varying scanning frequencies.

Figure 4:
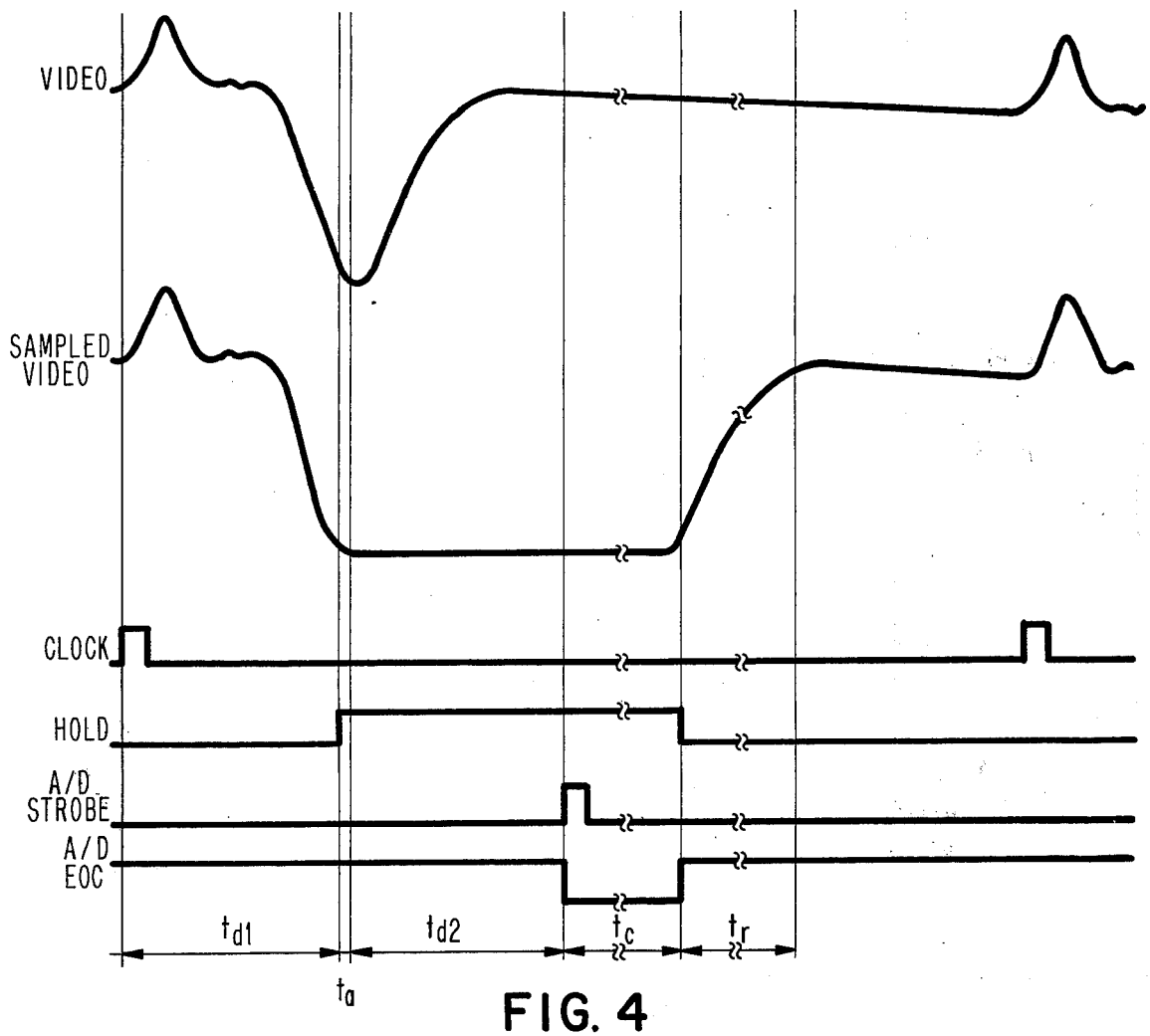

FIG. 4 is a timing diagram showing the relationship of various signals used in the present invention.

Figure 1:
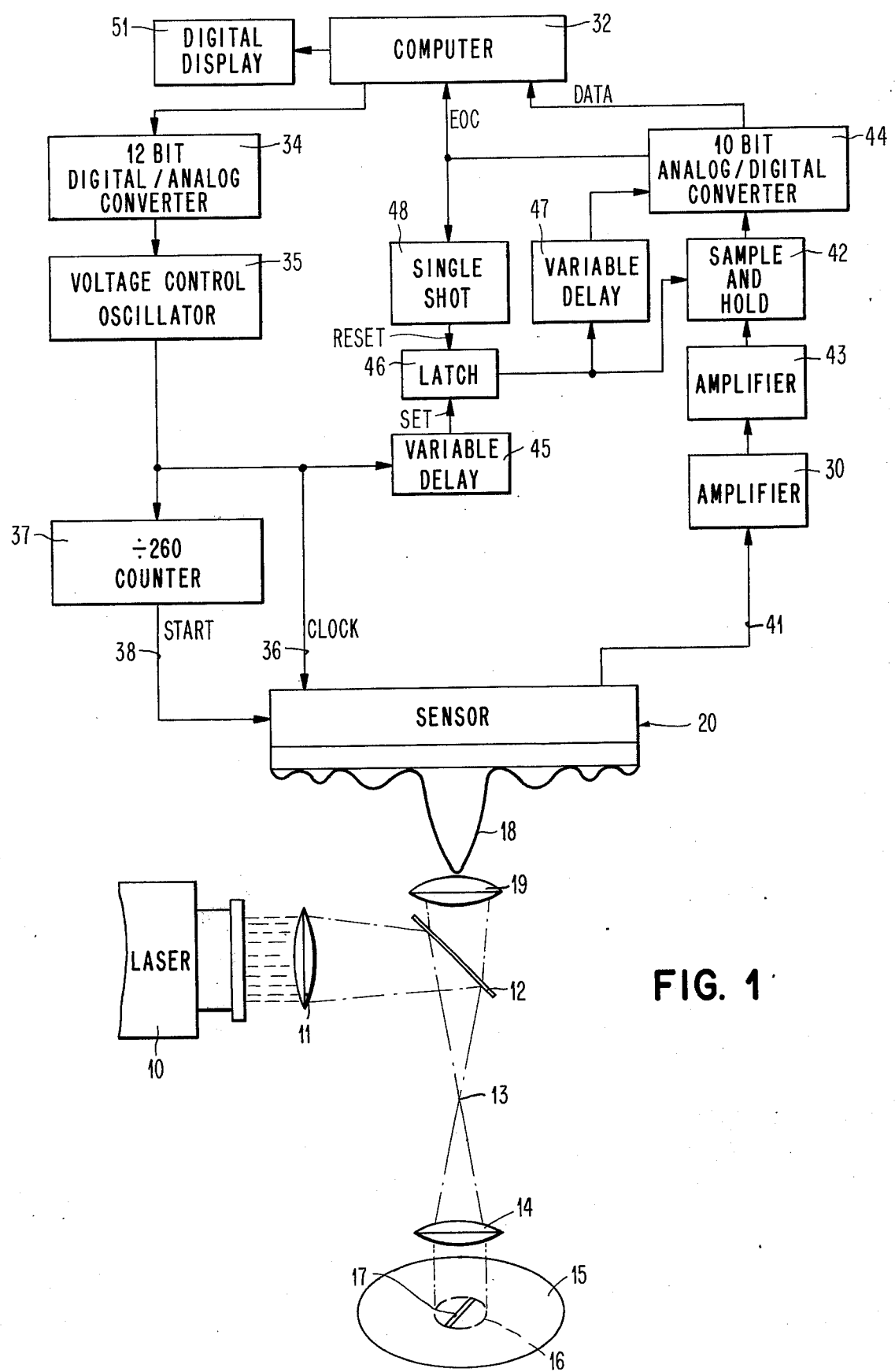
FIG. 1 is a schematic view of the over-all system of the present invention.

Referring to the drawings and particularly FIG. 1, there is shown a source of monochromatic light such as a laser 10. One suitable example of the laser 10 is a Stabilite 5 milliwatt helium neon gas laser sold by Spectra Physics Inc. as model 120 and having a wave length of 6328 A.

The collimated light from the laser 10, which provides a spot of 0.040 in., is directed through a lens 11 which focuses the light to a focal point 13 after reflection from a beam splitter 12. The beam splitter 12 directs 50% of the light to the focal point 13 while allowing the other 50% of the light to pass therethrough.

The light then diverges from the focal point 13 and passes through an objective lens 14, which is placed a focal distance beyond the common focal point 13. This configuration produces collimated light emanating from the objective lens 14. The diameter of the spot is determined by the ratio of the focal lengths of the lenses 11 and 14 and the size of the original beam incident on the lens 11.

One suitable example of the focusing lens 11 is a Rolyn Achromat focusing lens with a focal length of 80 mm sold by E. Leitz Inc. as model 20.0210, while one suitable example of the objective lens 14 is sold by E. Leitz Inc. as model 569004 and has a numerical aperture of 0.6 and a focal length of 8 mm. This combination of lenses produces a collimated beam 0.004 in. in diameter exiting from the objective lens 14.

By this means, a collimated spot of light is applied to a target 15, which could be a semiconductor wafer, for example, as a plane wave front. The spot of light is applied to the target 15 to provide a spot 16 having a diameter of 0.004 in. A line 17, which is formed as an etched opening or a metal plateau, for example, is disposed on the target 15 within the spot 16.

Accordingly, when the spot of collimated monochromatic light from the laser 10 forms the spot 16 on the target 15, diffracted light is reflected therefrom through the objective lens 14 and is focused at the focal point 13, which also is the back focal point of the lens 14, to produce a diffraction pattern 18. The beam splitter 12 allows 50% of the diffracted light, which forms the diffraction pattern 18, to pass therethrough to a relay lens 19, which re-images the diffraction pattern 18 onto a sensor 20.

The sensor 20 must sense the intensity of the light of the diffraction pattern 18 at each of a plurality of positions and be capable of providing a voltage indicating the light intensity at each position. The relay lens 19 is utilized to insure that the diffraction pattern 18 is imaged with the required magnification at the sensor 20.

One suitable example of the relay lens 19 is sold by E. Leitz Inc. as model 549021. One suitable example of the sensor 20 is a solid-state line scanner sold by Recticon Corporation as model RL-256DA. The solid-state line scanner (model RL-256DA) of Reticon Corporation has 256 silicon photodiodes mounted on one mil centers.

Figure 2:
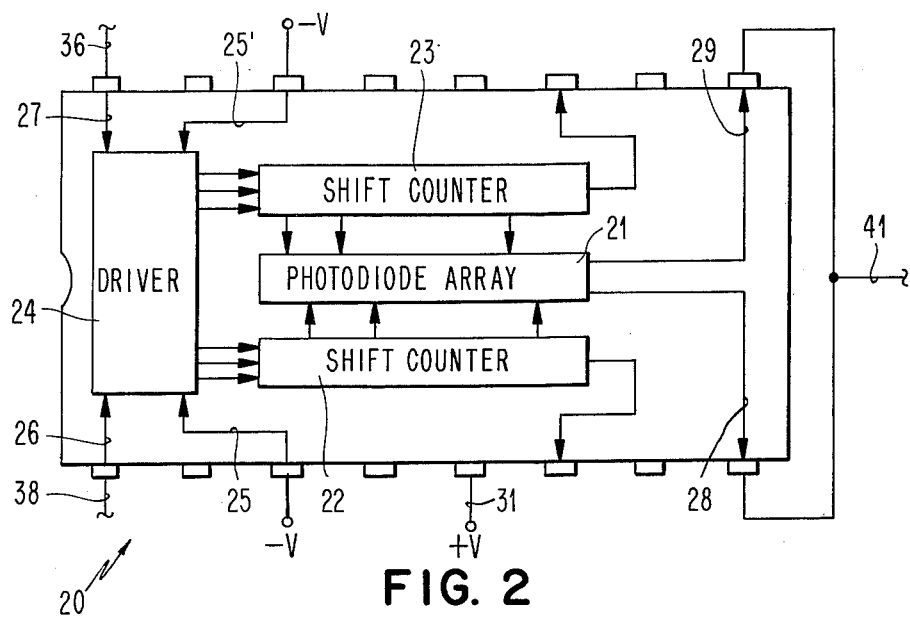
FIG. 2 is a schematic view of the sensor used in the system of FIG. 1.

As shown in FIG. 2, the 256 photodiodes of the solid-state line scanner (model RL-256DA) of Reticon Corporation are arranged in an array 21 to produce a separate video output signal from each of the photodiodes during a serial scan thereof. The array 21 has an even shift counter 22 and an odd shift counter 23 connected thereto with each of the shift counters connected to an MOS driver 24.

The driver 24 receives negative voltage signals, −V, from a line 25 and a line 25'. The start pulse is supplied to the driver 24 by a line 26 while clock pulses are supplied to the driver 24 by a line 27.

Output line 28 supplies from the even photodiodes of the array 21, and output line 29 supplies video signals from the odd photodiodes of the array 21. The output lines 28 and 29 of the Reticon solid-state line scanner are combined together before being supplied to an amplifier 30 (see FIG. 1). The amplifier 30 is sold by Reticon Corporation as model CA-10 operational amplifier and is operated as a current amplifier with the value of its resistors and capacitors selected for the scan rates.

A positive voltage, +V, is supplied to the sensor 20 (see FIG. 2) by a line 31. The positive voltage, +V, could be five volts while the voltage, −V, could be −18 volts.

To scan the photodiodes of the array 21 of the sensor 20, signals are supplied from a computer 32 (see FIG. 1), which can be an IBM 360/30 computer, for example, to a scan generator to indicate the scan rate. The scan generator includes a twelve bit digital to analog converter 34 receiving a digital input, which is the scan rate, from the computer 32 and providing an analog output therefrom. One suitable example of the twelve bit digital to analog converter 34 is sold by Analog Devices Inc. as model DAC 12 TBN 10 BF.

The output of the digital to analog converter 34 is supplied to a voltage control oscillator 35, which controls the frequency with which the photodiodes of the array 21 of the sensor 20 are scanned. One suitable example of the voltage control oscillator 35 is sold by Wavetek as model 134.

The output of the voltage control oscillator 35 supplies clock pulses through a line 36 to the clock input line 27 (see FIG. 2) and the driver 24 as an input to the shift counters 22 and 23 of the Reticon solid-state line scanner. The output of the voltage control oscillator 35 (see FIG. 1) also is supplied to a counter 37 which is a divide by 260 counter. That is, the counter 37 produces a pulse on its output line 38 to the start pulse input line 26 of the sensor 20 only for each 260 pulses from the voltage control oscillator 35. The counter 37 is of the type sold by Reticon Corporation for use with its model RL-256DA solid-state line scanner.

The counter 37 supplies the start pulse to the driver 24 of the Reticon solid-state line scanner for supply to one of the shift counters 22 and 23 thereof. Thus, each start pulse from the counter 37 provides a bit to the odd shift counter 23 of the Reticon solid-state line scanner to start scanning of each of the photodiodes of the array 21 in series. The clock pulses from the voltage control oscillator 35 control the period of time that the voltage signal, which represents the intensity of light at the photodiode, is transmitted therefrom on a video line 41 and clock the bit to each of the photodiodes of the array 21 in series.

Furthermore, since the time period for each complete scan is the same in that completion of the scan of the 256 photodiodes of the array 21 results in starting over at the first photodiode, the voltage control oscillator 35 controls the period of time that each of the photodiodes of the array 21 receives light from the diffraction pattern 18. Accordingly, the period of time that each of the 256 photodiodes of the array 21 of the Reticon solid-state line scanner is allowed to receive light created by the diffraction pattern 18 is controlled. That is, by changing the output from the computer 32 through the digital to analog converter 34 to the voltage control oscillator 35, different frequencies of scanning of the photodiodes of the array 21 of the sensor 20 are obtained.

The photodiodes of the Reticon solid-state line scanner operate in a charge storage mode. As the start pulse is applied from the counter 37, each of the photodiodes of the array 21 of the sensor 20 sequentially dumps its charge into the video line 41, which has the lines 28 and 29 connected thereto, from which it is supplied to the amplifier 30. Thus, as the frequency is decreased, a larger charge accumulates on each of the photodiodes of the array 21 of the sensor so that the signal on the video output line 41 is greater. Therefore, by decreasing the frequency, one is able to increase the intensity at each of the photodiodes except those having a zero intensity and, therefore, increase the voltage representing this intensity.

The signal on the output line 41 is supplied to a sample and hold circuit 42 after being amplified by the amplifier 30 and an amplifier 43. One suitable example of the sample and hold circuit 42 is sold by Datel Systems Inc. as model SHM-2. One suitable example of the amplifier 43 is sold by Telecdyne Philbrick as model 1321/10.

The sample and hold circuit 42 holds the peak voltage produced by each signal on the line 41. Then, the peak signal is supplied to a ten bit analog to digital converter 44. One suitable example of the analog to digital converter 44 is sold by Datel Systems Inc. as model ADC-N10B-3B.

The analog to digital converter 44 coverts the voltage to a digital number for supply to the computer 32. The digital number supplied to the computer 32 can vary from zero to 256 with each number representing a different voltage.

The sample and hold circuit 42 is connected to the voltage control oscillator 35 through a variable delay 45 and a latch 46 whereby the sample and hold circuit 42 is activated a predetermined period of time after the voltage control oscillator 35 supplies a clock pulse to the clock input line 27 of the sensor 20 by the latch 46 being set. As shown in FIG. 4, the hold mode strobe to the sample and hold circuit 42 is supplied a period of time, $t_{d1}$, after the clock pulse is supplied from the voltage control oscillator 35. Thus, as shown in FIG. 4, the negative going portion of the video signal on the line 41 is captured in the sample and hold circuit 42.

The signal from the latch 46 also is supplied through a variable delay 47 (see FIG. 1) to the analog to digital converter 44 as an analog to digital strobe (A/D strobe). As shown in FIG. 4, the A/D strobe to the analog to digital converter 44 is applied a predetermined period of time, $t_a$ and $t_{d2}$, after the signal to the sample and hold circuit 42.

At the completion of conversion of the sampled voltage from the sample and hold circuit 42 by the analog to digital converter 44 to a digital signal (coversion time is indicated by $t_c$ in FIG. 4), the analog to digital converter 44 produces an end of conversion (EOC) signal and is inactivated. This signal, which is identified as A/D EOC in FIG. 4 and went down at the start of conversion, is supplied to the computer 32 and to a single shot 48, which is a monostable multivibrator.

The output of the single shot 48 resets the latch 46 whereby the hold mode strobe falls to inactivate the sample and hold circuit 42. The minimum recovery time of the sample and hold circuit 42 to 99% of its full scale input is indicated as $t_r$ in FIG. 4. While the next clock pulse is shown as occurring therebeyond, it should be understood that the next clock pulse could occur at the end of $t_r$ in FIG. 4.

Each of the time periods of FIG. 4 is dependent on the particular parameters desired. As an example, each of $t_{d1}$ and $t_{d2}$ could be 1 microsecond, $t_a$ could be 0.1 microsecond, $t_c$ could be 4 microseconds, and $t_r$ could be 2.5 microseconds. Accordingly, the total cycle time would be 8.6 microseconds.

The first scans of the photodiodes of the array 21 of the sensor 20 are made with a selected frequency which results in the zero intensity positions being located in some instances. However, in other instances, depending on the intensity of the diffraction pattern 18, it may be necessary to scan the photodiodes of the array 21 of the sensor 20 at more than one frequency until the zero intensity positions are located.

Thus, the computer 32 has a software program in which the inputs from the analog to digital converter 44 are compared with known data to determine if the zero intensity positions of the diffraction pattern 18 are ascertainable. If they are not, the computer 32 supplies a signal to the digital to analog converter 34 to cause an automatic decrease in the frequency of the scan during the next scanning cycles. This continues until two adjacent zero intensity positions of the diffraction pattern 18 can be determined.

As shown in FIGS. 3A, 3B, and 3C, there are three different curves for different scan frequencies. FIG. 3A illustrates the voltage relative to photodiode position when the two pattern edges are initially introduced within the laser spot. FIG. 3B shows an increase in sampling time per photodiode which results in a percentage of the diodes reaching a saturated value and zero positions being isolated to specific zones. FIG. 3C shows a further increase in sampling time per photodiode which results in a higher percentage of saturated diodes and greater isolation of zero positions. By following this scheme of detection, one is able to locate very precisely all zero intensity positions in the diffraction pattern presented.

This is because the increased time for sampling each of the photodiodes of the array 21 of the sensor 20 results in each of these photodiodes having a greater voltage due to being exposed to the light of the diffraction pattern 18 for a longer period of time so that there is a pronounced difference between a very small light intensity and zero intensity. This is becuase there is no voltage produced by zero intensity.

While each of the curves in FIGS. 3A, 3B, and 3C shows the zero intensity positions having a voltage, it should be understood that this voltage is a noise level. Furthermore, while only two of the zero intensity positions have been identified at 49 and 50, it should be understood that there are other zero intensity positions shown in FIG. 3C and the distance between any two of these adjacent zero intensity positions could be employed in determining the distance between the two line edges of the line 17, which produced the diffraction pattern 18.

When the voltage obtained from the analog to digital converter 44 is such that the zero intensity positions can be determined, the computer 32 determines the locations of the zero intensity positions. Then, the distance between the two line edges is obtained by using the formula:

$$\text{distance between line edges} = \frac{2 \times (\text{wavelength of light}) \times (\text{effective focal length}) \times (\text{specific minima number})}{\text{distance between symmetric zero positions}}$$

In the foregoing formula, the "specific minima number" is determined by which of the symmetrical zero intensity positions are used.

Thus, the specific minima number is one if the zero intensity positions 49 and 50 of FIG. 3C are used. If the next adjacent zero intensity positions are used, then the specific minima number is two.

This does not alter the solution to the formula since the increase in the specific minima number is accompanied by an increase in the denominator due to the distance between the symmetrical zero intensity positions increasing by the same factor. That is, if the distance between the zero intensity positions 49 and 50 is 50 mils, then the distance between the next adjacent zero intensity positions is one hundred mils.

If adjacent non-symmetrical zero intensity positions are used rather than symmetrical zero intensity positions, then the specific minima number is ½. Thus, the distance between adjacent non-symmetrical zero intensity positions would be 25 mils.

The determination of the numerator is really the system calibration constant. This determination can be performed by direct measurement of the wavelength of light and the effective focal length or can be estimated by introducing known line widths and measuring the system responses.

Since the numerator of the expression is controllable by the system design, one is able to scale the relationship of distance between zero positions in the detector plane to the line width in the wafer plane. This flexibility allows choice of the range of line widths to be measured and the choice of sensitivity to dimensional change. The distance between the two line edges (This can be the width of the line 17, for example.) is then supplied to a digital display 51.

While the present invention has shown and described the sensor 20 as using Reticon's model RL-256DA solid-state line scanner, it should be understood that any other suitable means could be employed in which the intensity of light could be stored and converted to a voltage. For example, an image dissector could be used, particularly in applying this method to two-dimensional pattern analysis.

While the present invention has shown and described the diffraction pattern 18 as being produced by a reflection of the light from the target 15, it should be understood that the present invention could be used to obtain the zero intensity positions with the diffraction pattern passing through a transparent medium rather than the opaque target 15. The sensor 20 would have to be located in conjunction with the lens system at the imaging plane.

While the present invention has shown and described the measuring of widths on a semiconductor wafer, it should be understood that the distance between any two parallel line edges, which are within the field of view and have no other line edge therebetween, could be made. It is only necessary that they produce a diffraction pattern.

While the present invention has described the measurement as determining the locations of two adjacent zero intensity positions, it should be understood that this is not a requisite for satisfactory operation although it is the quickest means for determining the distance between two line edges. Thus, the location of any two zero intensity positions in the diffraction pattern can be employed if it is known which two zero intensity positions are being utilized.

Thus, the present invention defines how to determine the distance between two line edges on a target from the separation of two well defined points (zero intensity) in a diffraction pattern. Therefore, any target containing two line edges can have the distance between these line edges measured by the present invention.

Accordingly, to measure a rectangle, for example, it is necessary to measure in two orthogonal directions to obtain the length and width of the rectangle. This can be accomplished with the system of the present invention by rotating the target 90°. It should be understood that the sensor 20 could be rotated 90° or a second sensor, which is perpendicular to the sensor 20, could be employed.

The present invention also might be utilized to define the minor and major diameters of an ellipse or the diameter of a circle. Thus, the distance between two parallel line edges, which are tangent to diametrically disposed portions of a circle, would define the diameter of the circle. Similarly, the distances between the parallel line edges, which are tangent to the ellipse at the major and minor axes thereof, would define the major and minor diameters of the ellipse.

If a circle were to be measured with the present invention, it would be necessary to know the zero intensity positions used since the aforesaid formula for determining the distance between line edges must be multiplied by 2.44 if the first symmetrical zero intensity positions are used. If the second zero intensity positions are used, then the aforesaid formula must be multiplied by 4.466. The various factors for multiplying the aforesaid formula are obtained from table 4-1 on page 65 of Introduction to Fourier Optics by J. W. Goodman and doubling these since the table is for a radius.

It is desired that two zero intensity positions, which are used in determining the diameter of a circle, be symmetrical. As used in the claims, "two substantially parallel line edges" includes the edges of a line, the edges of a square or rectangle, and the parallel tangent line edges of a circle or an ellipse.

While the present invention has shown and described the measurement of a line width or pattern overlay after the actual processing has been completed, it should be understood that the present invention may be employed to monitor specific dimensions during various portions of the process. The real time monitoring is possible because the diffraction pattern analysis of the present invention enables rapid measurement response, extreme sensitivity to dimensional change, and wafer positional invariance.

positional invariance.

An advantage of this invention is that the distance between two adjacent line edges can be accurately measured without having to engage the target having the line edges. Another advantage of this invention is that fine alignment of the target is not required since the line edges can be disposed in any portion of the spot of light and the distance therebetween obtained. A further advantage of this invention is that focusing of the target in a particular position is not necessary as long as it is within the direction of illumination. Still another advantage of this invention is that minima of small lines are widely separated so that measurement of small lines such as linewidths smaller than one micron, for example, can be accomplished to very high precision. A still further advantage of this invention is that it is relatively low cost in comparison with any previously available system.

While the invention has been particularly shown and described with reference to a preferred embodiment thereof, it will be understood by those skilled in the art that various changes in form and details may be made therein without departing from the spirit and scope of the invention.

What is claimed is:

1. A method of measuring the distance between two substantially parallel line edges on a target including:
   applying a spot of collimated monochromatic radiation of a selected wavelength to a portion of the target having the two line edges which are to have the distance therebetween measured to obtain a diffraction pattern from the portion of the target illuminated by the spot;
   imaging the diffraction pattern to a sensor;
   controlling the time period that the sensor receives radiation from each of a plurality of positions of the diffraction pattern for conversion into separate signals related to the intensity of the radiation for each of the plurality of positions of the diffraction pattern;
   periodically increasing the radiation received by the sensor from each of the plurality of positions of the diffraction pattern during the controlled time period until the contrast between at least two of the zero intensity positions and the positions of the diffraction pattern adjacent to each of the zero intensity positions is sufficient to enable the determination of the location of at least two zero intensity positions of the diffraction pattern;

determining the locations of at least two zero intensity positions in the diffraction pattern after the diffraction pattern is imaged to the sensor and in accordance with the separate signals produced from the sensor for each of the plurality of positions of the diffraction pattern;

and obtaining the distance between the two line edges in accordance with the distance between two zero intensity positions in the diffraction pattern.

2. The method according to claim 1 in which the diffraction pattern is obtained from the target by reflection.

3. The method according to claim 2 including periodically increasing the radiation received by the sensor from each of the plurality of positions of the diffraction pattern during the controlled time period by periodically increasing the controlled time period for each of the plurality of positions of the diffraction pattern.

4. The method according to claim 2 in which the light intensity at each of a plurality of positions of the diffraction pattern is obtained through the sensor storing a charge related to the intensity of light from the diffraction pattern at each of the plurality of positions for the controlled time period.

5. The method according to claim 4 including periodically increasing the radiation received by the sensor from each of the plurality of positions of the diffraction pattern during the controlled time period by periodically increasing the magnitude of each of the stored charges until the difference between the magnitudes of the stored charges at two of the zero intensity positions of the diffraction pattern and the positions of the diffraction pattern adjacent to each of the zero intensity positions of the diffraction pattern is sufficient to enable determination of the location of at least two zero intensity positions of the diffraction pattern.

6. The method according to claim 1 in which the light intensity at each of a plurality of positions of the diffraction pattern is obtained through the sensor storing a charge related to the intensity of light from the diffraction pattern at each of the plurality of positions for the controlled time period.

7. The method according to claim 6 including periodically increasing the radiation received by the sensor from each of the plurality of positions of the diffraction pattern during the controlled time period by periodically increasing the magnitude of each of the stored charges until the difference between the magnitudes of the stored charges at two of the zero intensity positions of the diffraction pattern and the positions of the diffraction pattern adjacent to each of the zero intensity positions of the diffraction pattern is sufficient to enable determination of the location of at least two zero intensity positions of the diffraction pattern.

8. A system for measuring the distance between two substantially parallel line edges on a target including:
means to apply a spot of collimated monochromatic radiation of a selected wavelength to a portion of the target having the line edges to be measured to obtain a diffraction pattern from the portion of the target illuminated by the spot;

sensing means to produce a separate signal in accordance with the light intensity at each of a plurality of positions of the diffraction pattern;

means to image the diffraction pattern from the target to said sensing means;

means to control the time period that said sensing means receives light from each of the plurality of positions of the diffraction pattern for conversion into the separate signals related to the intensity of the light for each of the plurality of positions of the diffraction pattern for the controlled time period;

means to periodically increase the light received by said sensing means from each of the plurality of positions of the diffraction pattern during the controlled time period until the contrast between at least two zero intensity positions of the diffraction pattern and the positions of the diffraction pattern adjacent to each of the zero intensity positions is sufficient to enable location of at least two zero intensity positions of the diffraction pattern;

and means to ascertain the location of at least two zero intensity positions in the diffraction pattern in accordance with the separate signals produced by said sensing means and to determine the distance between the two line edges in accordance with the distance between two zero intensity positions in the diffraction pattern.

9. The system according to claim 8 in which said periodically increasing means includes means to cause said control means to increase the time period periodically until said ascertaining means locates at least two zero intensity positions in the diffraction pattern.

10. The system according to claim 9 including means to obtain the diffraction pattern by reflection from the target.

11. The system according to claim 8 in which:
said sensing means includes separate means to store a charge related to the intensity of light from the diffraction pattern at each of the plurality of positions;

and said control means controls the period of time that each of said separate means stores a charge related to the intensity of light, said control means causing each of said separate means to store a charge related to the intensity of light for the same period of time.

12. The system according to claim 11 including means to obtain the diffraction pattern by reflection from the target.

13. The system according to claim 11 in which said periodically increasing means includes means to periodically increase the magnitude of the stored charge at each of said separate means until the difference between the magnitudes of the stored charges at two of the zero intensity positions of the diffraction pattern and the positions adjacent to each of the zero intensity positions of the diffraction pattern is sufficient for said ascertaining means to locate at least two zero intensity positions of the diffraction pattern.

14. The system according to claim 13 including means to obtain the diffraction pattern by reflection from the target.

15. The system according to claim 8 including means to obtain the diffraction pattern by reflection from the target.

16. The system according to claim 8 in which:
said sensing means includes separate means to store a charge related to the intensity of light from the diffraction pattern at each of the plurality of positions;

and said periodically increasing means includes means to periodically increase the magnitude of the stored charge at each of said separate means until the difference between the magnitudes of the stored charges at two of the zero intensity positions of the diffraction pattern and the positions adjacent to each of the zero intensity positions of the diffraction pattern is sufficient for said ascertaining means to locate at least two zero intensity positions of the diffraction pattern.

17. The system according to claim 16 including means to obtain the diffraction pattern by reflection from the target.

18. The system according to claim 16 in which:
said control means controls the period of time that each of said separate means stores a charge related to the intensity of the light;
and said periodically increasing magnitude means includes means to cause said control means to periodically increase the period of time that each of said separate means stores a charge related to the intensity of the light.

19. The system according to claim 18 including means to obtain the diffraction pattern by reflection from the target.

20. A system for measuring the distance between two substantially parallel line edges on a target including:
means to apply a spot of collimated monochromatic radiation of a selected wavelength to a portion of the target having the line edges which are to have the distance therebetween measured to obtain a diffraction pattern from the portion of the target illuminated by the spot;
sensing means to produce a separate signal in accordance with the radiation intensity at each of a plurality of positions of the diffraction pattern;
means to image the diffraction pattern from the target to said sensing means;
means to control the time period that said sensing means receives radiation from each of the plurality of positions of the diffraction pattern for conversion into the separate signals related to the intensity of the radiation for each of the plurality of positions of the diffraction pattern for the controlled time period;
means to periodically increase the radiation received by said sensing means from each of the plurality of positions of the diffraction pattern during the controlled time period until the contrast between at least two zero intensity positions of the diffraction pattern and the positions of the diffraction pattern adjacent to each of the zero intensity positions is sufficient to enable location of at least two zero intensity positions of the diffraction pattern;
and means to determine the location of at least two zero intensity positions in the diffraction pattern after the diffraction pattern is imaged to said sensing means by said imaging means and in accordance with the separate signals produced from said sensing means for each of the plurality of positions of the diffraction pattern and to obtain the distance between the two line edges in accordance with the distance between two zero intensity positions in the diffraction pattern.

21. The system according to claim 20 in which:
said sensing means includes separate means to receive radiation related to the intensity of radiation from the diffraction pattern at each of the plurality of positions;
and said control means controls the period of time that each of said separate means receives the radiation related to the intensity of radiation.

22. The system according to claim 21 including means to obtain the diffraction pattern by reflection from the target.

23. The system according to claim 21 in which said periodically increasing means includes means to cause said control means to periodically increase the time period until said ascertaining means locates at least two zero intensity positions of the diffraction pattern.

24. The system according to claim 23 including means to obtain the diffraction pattern by reflection from the target.

25. The system according to claim 20 in which:
said sensing means includes separate means to receive radiation related to the intensity of radiation from the diffraction pattern at each of the plurality of positions;
and said control means controls the period of time that each of said separate means receives the radiation related to the intensity of radiation, said control means causing each of said separate means to receive radiation related to the intensity of radiation for the same period of time.

26. The system according to claim 25 including means to obtain the diffraction pattern by reflection from the target.

27. The system according to claim 25 in which said periodically increasing means includes means to cause said control means to periodically increase the time period until said ascertaining means locates at least two zero intensity positions of the diffraction pattern.

28. The system according to claim 27 including means to obtain the diffraction pattern by reflection from the target.

29. The system according to claim 20 in which said periodically increasing means includes means to cause said control means to periodically increase the time period until said ascertaining means locates at least two zero intensity positions in the diffraction pattern.

30. The system according to claim 29 including means to obtain the diffraction pattern by reflection from the target.

31. The system according to claim 20 including means to obtain the diffraction pattern by reflection from the target.

32. The method according to claim 1 including periodically increasing the radiation received by the sensor from each of the plurality of positions of the diffraction pattern during the controlled time period by periodically increasing the controlled time period for each of the plurality of positions of the diffraction pattern.

* * * * *